(12) United States Patent
Krochmal et al.

(10) Patent No.: US 6,870,934 B2
(45) Date of Patent: Mar. 22, 2005

(54) AUDIO LOUDSPEAKER DETECTION USING BACK-EMF SENSING

(75) Inventors: Andrew C. Krochmal, Plymouth, MI (US); John E. Whitecar, Plymouth, MI (US); Robert K. Cadena, Dearborn, MI (US); Gregory R. Hamel, Livonia, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 463 days.

(21) Appl. No.: 10/195,206

(22) Filed: Jul. 15, 2002

(65) Prior Publication Data

US 2004/0008848 A1 Jan. 15, 2004

(51) Int. Cl.7 .............................................. H04R 29/00
(52) U.S. Cl. ......................................... 381/59; 381/96
(58) Field of Search ............................. 381/59, 58, 96, 381/86; 455/226.1

(56) References Cited

U.S. PATENT DOCUMENTS

| | | |
|---|---|---|
| 5,042,070 A | 8/1991 | Linna et al. |
| 5,361,305 A | 11/1994 | Easley et al. |
| 5,450,624 A | 9/1995 | Porambo et al. |
| 5,815,584 A | 9/1998 | Whitecar et al. |

FOREIGN PATENT DOCUMENTS

| | | |
|---|---|---|
| DE | 19544658 | 3/1997 |
| EP | 0841570 A3 | 5/1998 |
| JP | 11 146496 | 5/1999 |

*Primary Examiner*—Ping Lee
(74) *Attorney, Agent, or Firm*—MacMillan, Sobanski & Todd LLC

(57) ABSTRACT

The presence or absence of a speaker connected to an output terminal of an audio system is determined based on the electro-generator properties of the speaker. The audio system includes an output amplifier coupled to the output terminal. The method includes driving the output amplifier with a predetermined drive signal sufficient to produce a predetermined speaker excursion if a speaker is connected to the output terminal. The output amplifier is then isolated from the output terminal. A signal at the output terminal is sensed after the output amplifier is isolated. The sensed signal is compared with a predetermined reference for determining whether a speaker back-EMF is present. A speaker detection signal is generated indicating absence of a speaker if the back-EMF is not present.

18 Claims, 4 Drawing Sheets

AUDIO LOUDSPEAKER DETECTION USING BACK-EMF SENSING

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to verifying the proper interconnection of audio speakers in automotive audio systems, and, more specifically, to detecting a back-EMF as an indication of the proper interconnection of a speaker.

During manufacture of an automotive vehicle, it is necessary to test the interconnection between an audio system and its loudspeakers in order to ensure the quality of the finished vehicle. During manufacture, various wiring problems can be experienced including failure to properly join the harness wiring to the speaker terminals, bent or broken terminals, and pinched or broken wires in the harness. These problems need to be detected and then corrected before a finished vehicle leaves the factory.

Existing speaker detection methods include what is known as a speaker walk-around test, wherein the audio system is placed into a test mode in which it sequentially sends an output audio signal (e.g., the output from an AM/FM radio tuner) individually to each speaker while a person listens to determine if proper sound comes from each speaker. Due to the loud ambient noise level in a vehicle assembly plant, however, it is difficult for a listener to detect the absence of noise from a single speaker. Consequently, detection errors occur.

It is also known to employ each speaker as a generator (i.e., a pick-up or microphone) to generate a signal for sensing the presence of a properly connected speaker. By forcibly moving a speaker cone, a voltage is created across the speaker. But since a speaker is not optimized to perform as a pick-up, a high sound-pressure level has been required to generate a detectible signal. The prior art has used a door closing or door slam to provide a sound pressure impulse to the speaker cone. If a speaker is present, then the door slam generates a voltage detectable by the audio system to verify the presence of a speaker. However, this method is time consuming and is not reliable. The test requires certain test conditions such as a substantially airtight passenger cabin with all windows raised in order to ensure the desired movement of the speaker cone. The pressurization of the cabin caused by the door slam is not well controlled or repeatable, which means that the test results are highly variable and therefore difficult to classify. Furthermore, the prior art methods are not well adapted for detecting intermittent speaker connection problems after a vehicle is put into service since they require interaction by a human test operator.

SUMMARY OF THE INVENTION

The present invention provides an advantageous speaker detection system which is fully automated and which is so accurate that it can be used to differentiate between different models of speakers that may be connected, thereby providing a further check that the proper speaker model has been installed in a particular vehicle.

In one aspect of the invention, a method is provided for detecting the presence of a speaker connected to an output terminal of an audio system. The audio system includes an output amplifier coupled to the output terminal. The method includes driving the output amplifier with a predetermined drive signal sufficient to produce a predetermined speaker excursion if a speaker is connected to the output terminal. The output amplifier is then isolated from the output terminal. A signal at the output terminal is sensed after the output amplifier is isolated. The sensed signal is compared with a predetermined reference for determining whether a speaker back-EMF is present. A speaker detection signal is generated indicating absence of a speaker if the back-EMF is not present.

DETAILED DESCRIPTION OF PREFERRED EMBODIMENTS

Figure 1:
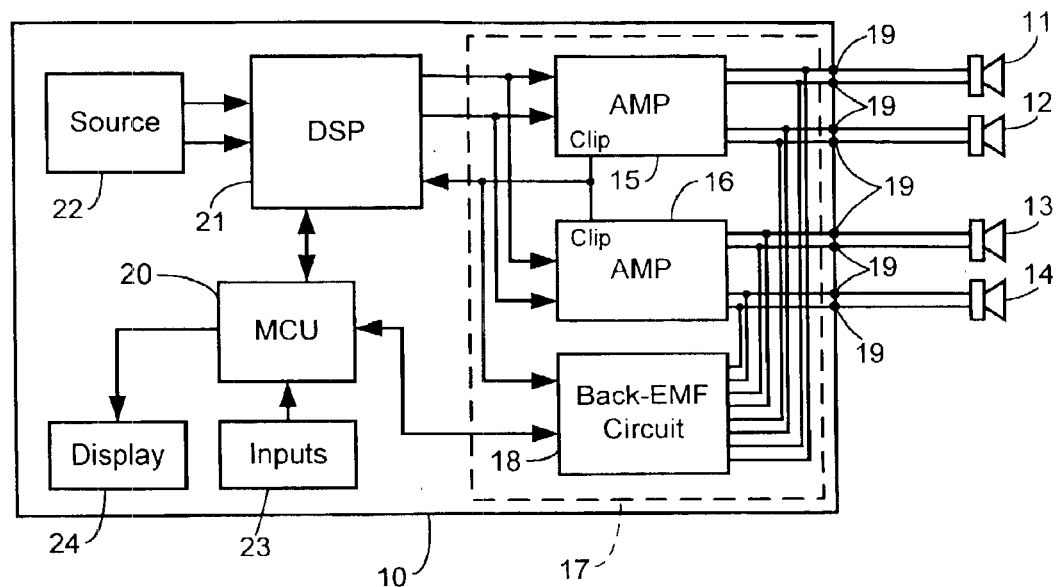
FIG. 1 is a block diagram showing an audio system according to the present invention.

Referring to FIG. 1, an audio system 10 is connected to a plurality of speakers 11–14. Output amplifiers (i.e., power amplifiers) 15 and 16 drive left and right stereo speakers from front and rear speaker sets, respectively. Audio system 10 may be contained within a single head unit, or an output section 17 may be contained in a separate power amplifier module, for example. A back-EMF circuit 18 is directly connected to audio system output terminals 19 for detecting back-EMF voltages to verify proper speaker interconnections as described later.

Audio system 10 includes an audio source 22 such as a radio tuner, cassette player, or compact disc player, for example. An audio signal from source 22 is provided to the input of a digital signal processor (DSP) 21 which outputs left and right stereo signals to amplifiers 15 and 16. A microcontroller unit (MCU) 20 communicates with DSP 21 and source 22 to control operation of the audio system. MCU 20 receives input commands from inputs 23 which may include push-button operator controls or an interface to a multiplex network whereby commands may be received from other locations in a vehicle. A display 24 is connected to MCU 20 for displaying status of the audio system to allow adjustment of audio parameters, such as volume, balance, fade, tuning, and track selection. Amplifiers 15 and 16 provide a clip detection output to back-EMF circuit 18 and to DSP 21.

It is well known that a speaker can act as both an electromotor (i.e., the speaker moves in response to an electrical stimulus) or a generator (i.e., a voltage is generated across the voice coil impedance in response to forced motion of the speaker cone). Typically, the output impedance across the output of the power amplifier is so low that any electromotive force (EMF) produced by artificial movement of the speaker is greatly attenuated (i.e., short-circuited). The present invention employs particular methods of causing a back-EMF and then detecting the back-EMF to classify the presence/non-presence of a speaker or even the type of speaker that is present.

Figure 2:
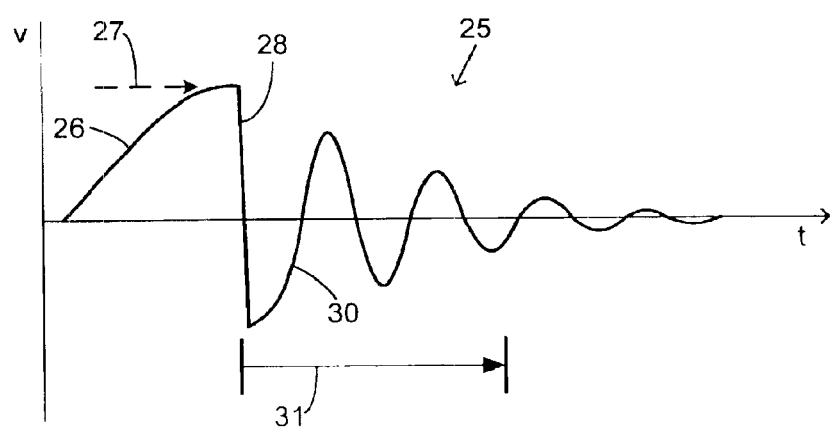
FIG. 2 is a waveform showing a speaker voltage, including a back-EMF produced by the speaker after being isolated from an amplifier.

FIG. 2 shows a waveform 25 representing a voltage across a speaker. A wave portion 26 corresponds to the speaker being driven by the output amplifier. During application of a drive signal to the speaker, the excursion of the speaker cone from its rest position follows the magnitude of the drive signal. Either a low frequency signal (e.g., below about 10 Hertz) or a dc drive signal may be employed. When a predetermined excursion (e.g., a maximum excursion) is reached as shown by arrow 27, the drive signal is terminated by isolating (i.e., disconnecting) the output amplifier and/or turning off the output amplifier so that it no longer provides a low impedance path between the speaker terminals. The polarity of waveform 25 reverses at 28 and an alternating back-EMF wave portion 30 is then produced which has a characteristic amplitude, frequency, and decay time for the particular speaker design. The back-EMF signal during a particular sample window 31 can be detected and classified to perform the speaker detection of the present invention.

Figure 3:
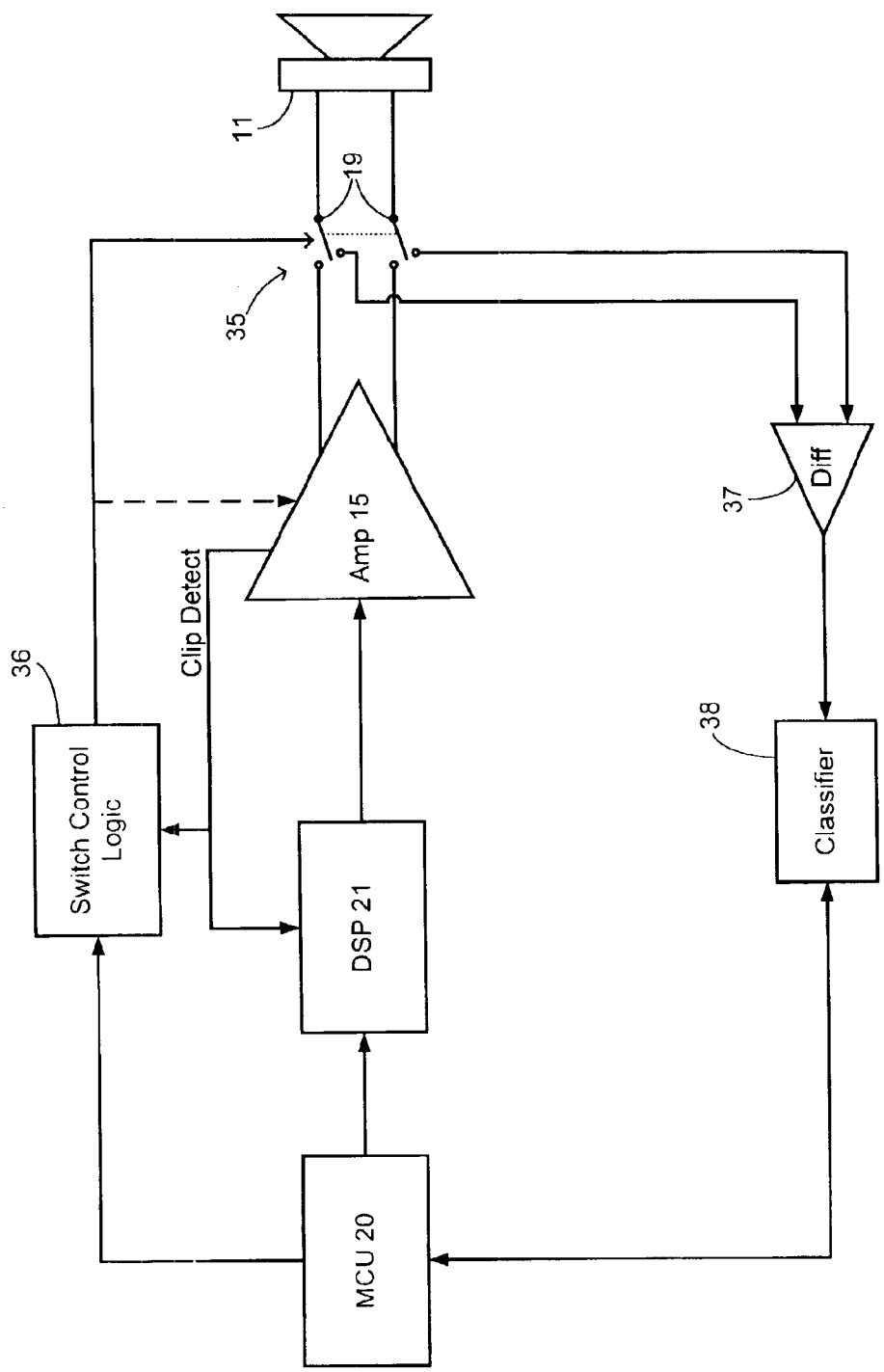
FIG. 3 is a block diagram showing portions of the audio system in greater detail.

FIG. 3 shows the invention in greater detail, wherein only one speaker is shown for clarity. Isolation of the output amplifier from the output terminals of the audio system is preferably obtained using series switches 35 for selectably connecting the output terminals of the audio system (i.e., the external terminals that are connected to the vehicle wiring leading to the speakers) with either the output of amplifier 15 or the input of a signal sensing amplifier 37. Amplifier 15 is preferably comprised of a differential amplifier to reduce the effects of noise coupled to the speaker wires. Therefore, amplifier 37 is a difference amplifier which converts the differential (i.e., not referenced to ground) back-EMF from speaker 11 into a single-ended difference signal for processing by a classifier 38. A speaker detection signal from classifier 38 indicates whether a speaker is present and/or what type of speaker is currently connected to the output terminals.

Switch control logic 36 has inputs connected to MCU 20 and to the clip detect output of amplifier 15, and has an output connected to switches 35 to control the switch conduction. During normal operation of the audio system, switch control logic 36 configures switches 35 to connect amplifier 15 to output terminals 19. When MCU 20 indicates that the audio system is in a test mode for detecting the presence of speakers, switch control logic 36 connects amplifier 15 to terminals 19 during the drive signal so that if the speaker is properly connected then a predetermined excursion is produced. While in the test mode and after the drive signal is completed, then switch control logic 36 switches states so that difference amplifier 37 is connected to terminals 19 and amplifier 15 is isolated from output terminals 19. In one preferred embodiment, the clip detect signal is employed to determine that a drive signal sufficient to produce maximum speaker cone excursion has been produced. The clip detect signal is also coupled to DSP 21 for the purpose of shutting off the drive signal at the same time that amplifier 15 is isolated from the output.

The output from switch control logic 36 may also be connected to amplifier 15 in order to turn amplifier 15 on and off. When turned off (i.e., powered down), the output impedance of amplifier 15 goes to a high state which would not attenuate the speaker back-EMF. If the response time of amplifier 15 to a turn-off signal is fast enough so that the high impedance state is reached before the speaker back-EMF signal has ceased, then it is possible in some embodiments to eliminate switches 35 and rely on the turning off of amplifier 15 to isolate it from terminals 19.

In another alternative embodiment, difference amplifier 37 can be eliminated by driving one speaker terminal to a predetermined voltage (e.g., to ac ground) and not isolating that one output of the output amplifier while the other output of the output amplifier is still isolated by a switch. This results in a single-ended signal being derived from the speaker terminals which can be directly input to classifier 38.

Figure 4:
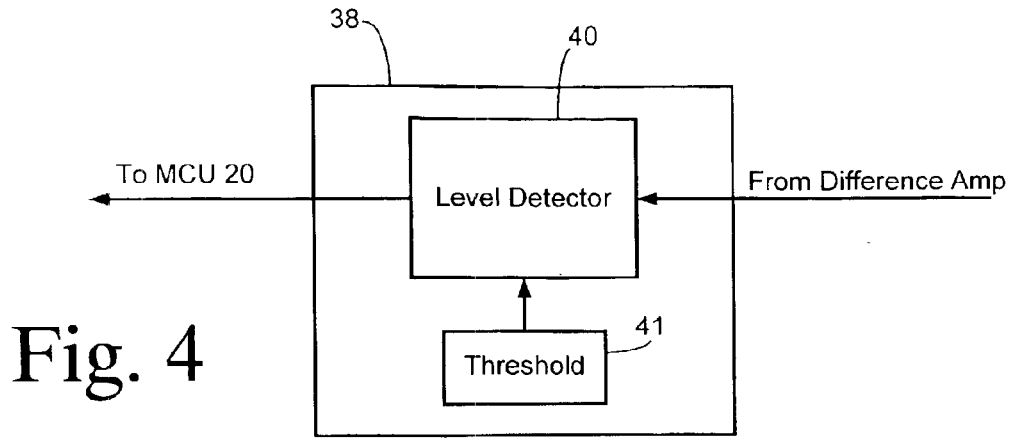
FIG. 4 is a block diagram showing one embodiment of a classifier of the present invention.

Classifier 38 can be implemented in a number of ways. In a first embodiment shown in FIG. 4, it is simply desired to detect the presence of a speaker without requiring the capability to distinguish between different speakers that might be connected. Thus, a level detector 40 receives the sensed speaker back-EMF signal from difference amplifier 37 and compares the detected level to a predetermined threshold 41. The detected level will exceed the predetermined threshold only if a generator (i.e., speaker) is connected to the audio system output terminals. Level detector 40 may use any conventional level detection, such as rectifying (e.g., squaring) the incoming signal and integrating it during the predetermined sampling window.

If present, the sensed back-EMF signal contains sufficient information to differentiate between different types or models of speakers, since differences in acoustic mass, compliance, and other factors create unique back-EMF signatures (e.g., peak amplitude, frequency, and decay rate). These signatures can be used to enable the audio system to verify the type of speaker that is present, either to signal an error if the wrong type of speaker is present or to adjust its output parameters for the type of speaker present.

Figure 5:
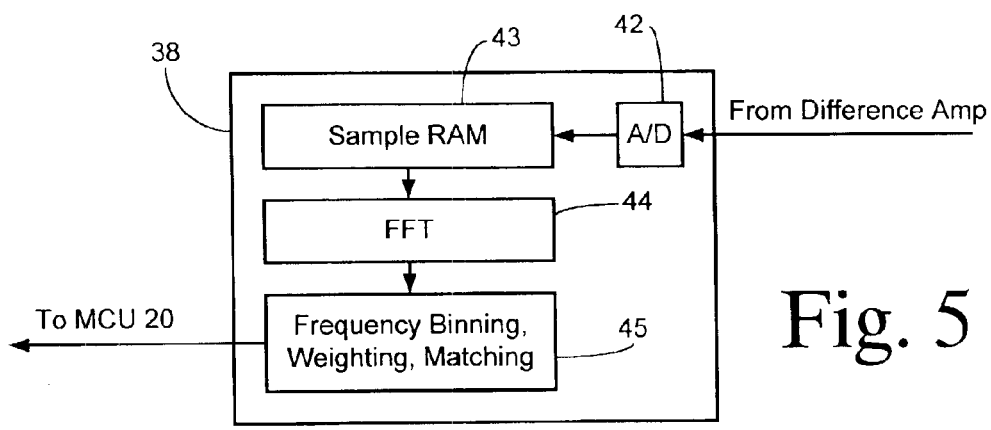
FIG. 5 is a block diagram of another embodiment of the classifier.

The differing signatures of a collection of target speakers that may potentially be used with a particular audio system or automotive vehicle are preferably measured in advance for programming into the audio system. FIG. 5 shows one preferred embodiment for detecting the speaker type wherein the sensed back-EMF signal from difference amplifier 37 is digitized in an analog-to-digital converter 42. The digitized waveform is stored in a sample random access memory (RAM) 43. A Fourier transform block 44 determines a frequency spectrum of the digitized waveform. Preferably, the spectrum is comprised of several frequency ranges or bins, with each bin having a corresponding power-frequency magnitude. Spectra of the target speakers that were similarly binned are compared to the measured spectrum. The bin magnitudes may be weighted to improved matching accuracy. A binning, weighting, and matching block 45 identifies the matching target speaker and sends an identifying signal to MCU 20. The elements of classifier 38 may be implemented within the DSP, for example.

Figure 6:
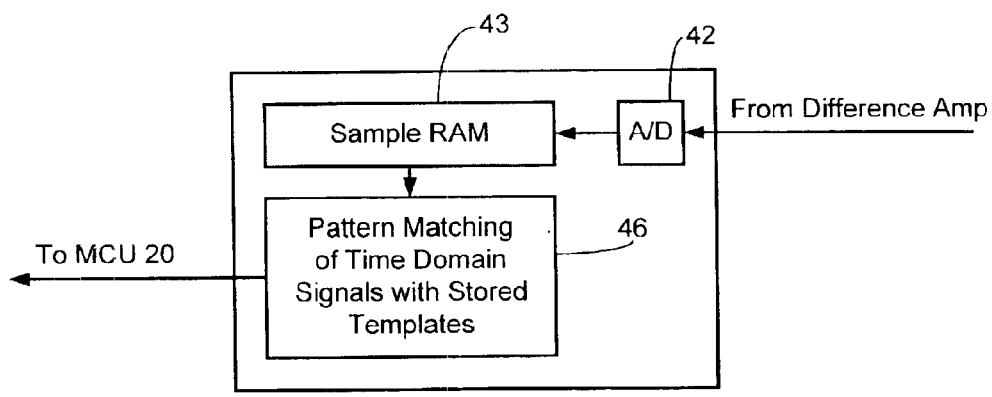
FIG. 6 is a block diagram of yet another embodiment of the classifier.

In the alternate embodiment of FIG. 6, the sampled waveform from sample RAM 43 is matched to a target speaker in the time domain. Thus, a pattern matching block 46 matches the sampled waveform with stored time-domain templates for the target speakers using conventional pattern matching techniques. A speaker identification signal is provided from block 46 to MCU 20.

Figure 7:
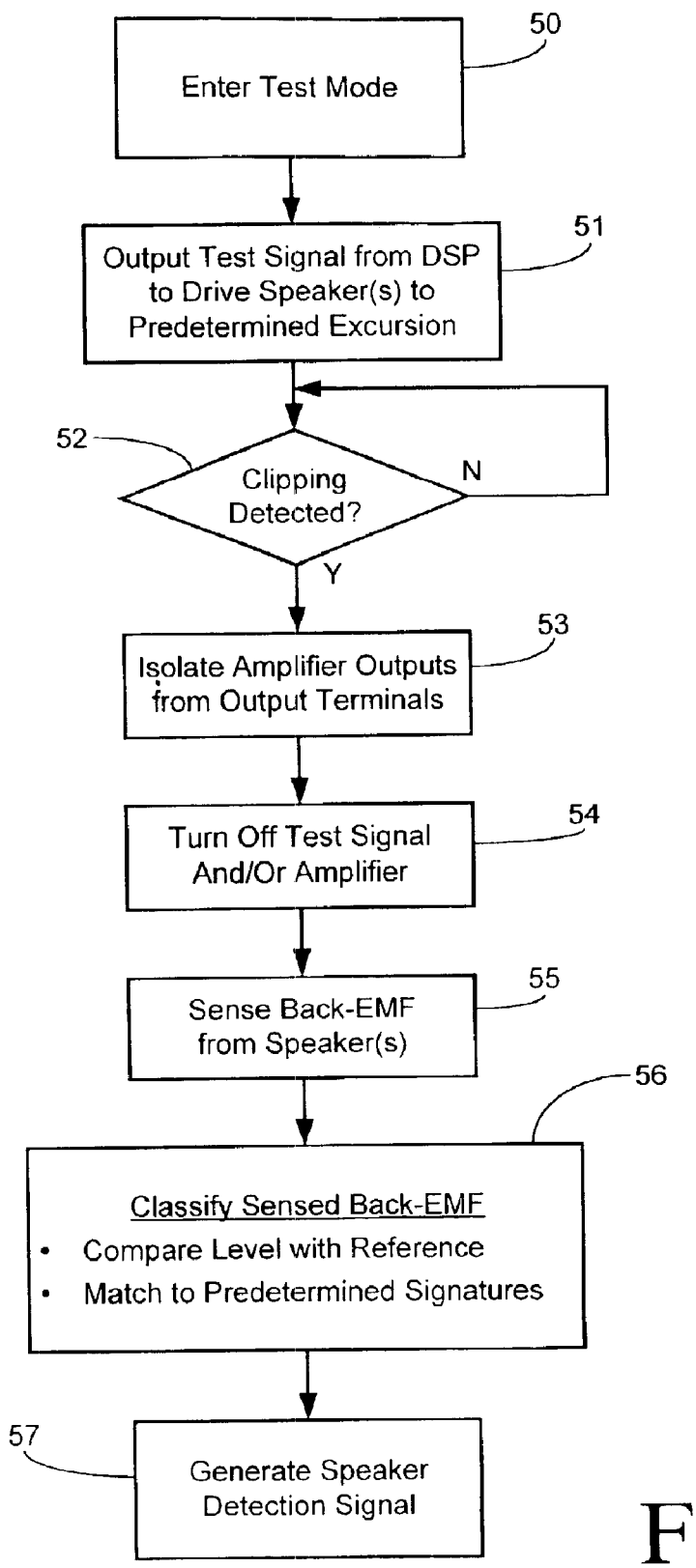
FIG. 7 is a flowchart showing a preferred method of the present invention.

A preferred method of operation of the present invention is shown in greater detail by the flowchart of FIG. 7. In step 50, the audio system enters the test mode e.g., in response to manual input of a special combination of key presses or automatically each time the audio system is turned on. Automatic testing is particularly helpful in detecting intermittent faults.

The test signal or drive signal for driving the speakers to their predetermined excursions is output by the DSP in step 51. As the test signal continues to be generated, a check is made in step 52 to determine if the output amplifier has detected clipping of the output (i.e., the amplifier output has reached its maximum). If not, then step 52 continues to loop. Once the clip detect signal appears, the outputs of the power amplifier are isolated from the speaker terminals in step 53.

In step 54, the test signal is turned off and, optionally, the amplifier may also be turned off. Any back-EMF signal from the speakers are sensed in step 55, and the sensed signals are classified in step 56. The classification may comprise the simple comparison of the detected level of the sensed signal with a reference (to tell only if some speaker is present) or the matching of the sensed signal with predetermined signatures of a collection of target speakers (to tell which of the target speakers is actually connected). In step 57, a speaker detection signal is generated to identify whether a good speaker connection has been detected and/or the identity of the speaker that was found. If the speaker detection signal indicates the absence of a speaker, then a message may be displayed by the audio system so that corrective measures can be ttaken.

What is claimed is:

1. A method of detecting the presence of a speaker connected to an output terminal of an audio system, wherein said audio system includes an output amplifier coupled to said output terminal, said method comprising the steps of:

driving said output amplifier with a predetermined drive signal sufficient to produce a predetermined speaker excursion if a speaker is connected to said output terminal;

isolating said output amplifier from said output terminal;

sensing a signal at said output terminal when said output amplifier is isolated;

comparing said sensed signal with a predetermined reference for determining whether a speaker back-EMF is present; and generating a speaker detection signal indicating absence of a speaker if said back-EMF is not present.

2. The method of claim 1 wherein said output amplifier includes a clip detector for generating a clip detect signal, wherein said predetermined drive signal drives said output amplifier into clipping, and wherein said clip detect signal initiates said isolating step.

3. The method of claim 2 wherein said predetermined drive signal is terminated in response to said clip detect signal.

4. The method of claim 1 wherein said predetermined drive signal is comprised of a frequency below about 10 Hz.

5. The method of claim 1 wherein said predetermined drive signal is comprised of a substantially DC signal.

6. The method of claim 1 further comprising the step of level detecting said sensed signal to generate an amplitude, wherein said comparing step is comprised of comparing said amplitude with said predetermined reference, and wherein said predetermined reference is a fixed threshold.

7. The method of claim 1 wherein said comparing step is comprised of pattern matching said sensed signal with a plurality of predetermined reference signatures corresponding to predetermined speakers in order to identify a one of said predetermined speakers that is present.

8. The method of claim 7 further comprising the step of transforming said sensed signal into a frequency-domain signal for said pattern matching.

9. An audio system for detecting a correct interconnection of a speaker, comprising:

an output terminal providing an external speaker connection;

an output amplifier within said audio system and coupled to said output terminal;

a test signal source coupled to said output amplifier for supplying a predetermined drive signal sufficient to produce a predetermined speaker excursion if a speaker is connected to said output terminal;

an amplifier isolation circuit for isolating said output amplifier from said output terminal after said audio signal source supplies said predetermined drive signal;

a detector coupled to said output terminal sensing a signal at said output terminal when said amplifier isolation circuit isolates said output amplifier; and a classifier determining whether a speaker is present in response to said sensed signal.

10. The audio system of claim 9 wherein said output amplifier includes a clip detector for generating a clip detect signal, wherein said predetermined drive signal drives said output amplifier into clipping, and wherein said clip detect signal activates said amplifier isolation circuit.

11. The audio system of claim 10 wherein said test signal source terminates said predetermined drive signal in response to said clip detect signal.

12. The audio system of claim 9 wherein said test signal source is comprised of a digital signal processor.

13. The audio system of claim 9 wherein said amplifier isolation circuit is comprised of a series switching element connect between said output amplifier and said output terminal.

14. The audio system of claim 13 wherein said amplifier isolation circuit is further comprised of a switch controller for rendering said series switching element conductive when not in a testing mode and for rendering said series switching element nonconductive when said clip detect signal is present during a testing mode.

15. The audio system of claim 9 wherein said detector is comprised of a difference amplifier.

16. The audio system of claim 9 wherein said classifier is comprised of a level detector for determining an amplitude of said sensed signal and comparing said amplitude with a predetermined threshold.

17. The audio system of claim 9 wherein said detector generates a sample waveform of said sensed signal and wherein said classifier compares said sample waveform with a plurality of speaker reference signatures corresponding to a plurality of predetermined speakers.

18. The audio system of claim 17 further comprising a transformer for transforming said sample waveform to a frequency spectrum, and wherein said plurality of speaker reference signatures are comprised of respective frequency spectra corresponding to said plurality of predetermined speakers.

* * * * *